(12) United States Patent
Or et al.

(10) Patent No.: US 8,980,761 B2
(45) Date of Patent: Mar. 17, 2015

(54) DIRECTIONAL SIO$_2$ ETCH USING LOW-TEMPERATURE ETCHANT DEPOSITION AND PLASMA POST-TREATMENT

(71) Applicant: Applied Materials, Inc., Santa Clara, CA (US)

(72) Inventors: David T. Or, Santa Clara, CA (US); Joshua Collins, Sunnyvale, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/031,371

(22) Filed: Sep. 19, 2013

(65) Prior Publication Data
US 2014/0094036 A1    Apr. 3, 2014

Related U.S. Application Data

(60) Provisional application No. 61/744,909, filed on Oct. 3, 2012.

(51) Int. Cl.
| | | |
|---|---|---|
| H01L 21/302 | (2006.01) | |
| H01L 21/3065 | (2006.01) | |
| H01L 21/02 | (2006.01) | |
| H01L 21/311 | (2006.01) | |

(52) U.S. Cl.
CPC ...... *H01L 21/3065* (2013.01); *H01L 21/02057* (2013.01); *H01L 21/31116* (2013.01)
USPC .......................................... 438/714; 438/706

(58) Field of Classification Search
None
See application file for complete search history.

(56) References Cited

U.S. PATENT DOCUMENTS

| | | | |
|---|---|---|---|
| 6,057,247 A | | 5/2000 | Imai et al. |
| 6,153,512 A | * | 11/2000 | Chang et al. .................. 438/624 |
| 2007/0123051 A1 | | 5/2007 | Arghavani et al. |
| 2009/0275205 A1 | | 11/2009 | Kiehlbauch et al. |
| 2010/0041212 A1 | | 2/2010 | Jinzu et al. |
| 2010/0210099 A1 | * | 8/2010 | Hur et al. ...................... 438/586 |
| 2011/0065276 A1 | * | 3/2011 | Ganguly et al. .............. 438/694 |
| 2011/0223755 A1 | * | 9/2011 | Kao et al. ...................... 438/585 |

FOREIGN PATENT DOCUMENTS

KR    10-2006-0133606    12/2006

OTHER PUBLICATIONS

International Search Report and Written Opinion dated Dec. 27, 2013 for PCT/US2013/060195; 12 pages.

* cited by examiner

*Primary Examiner* — Shamim Ahmed
*Assistant Examiner* — Bradford Gates
(74) *Attorney, Agent, or Firm* — Patterson & Sheridan, LLP

(57) ABSTRACT

Methods for processing a substrate are described herein. Methods can include positioning a substrate comprising silicon in a processing chamber, delivering a plasma to the surface of the substrate while biasing the substrate, exposing the surface of the substrate to ammonium fluoride (NH$_4$F), and annealing the substrate to a first temperature to sublimate one or more volatile byproducts.

20 Claims, 4 Drawing Sheets

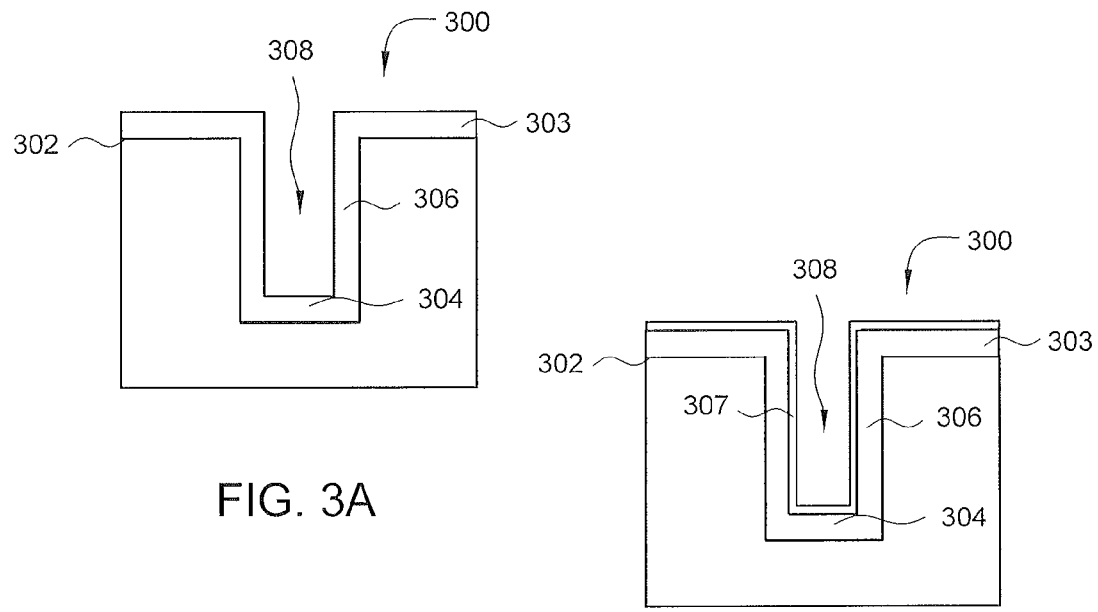
FIG. 3A
FIG. 3B
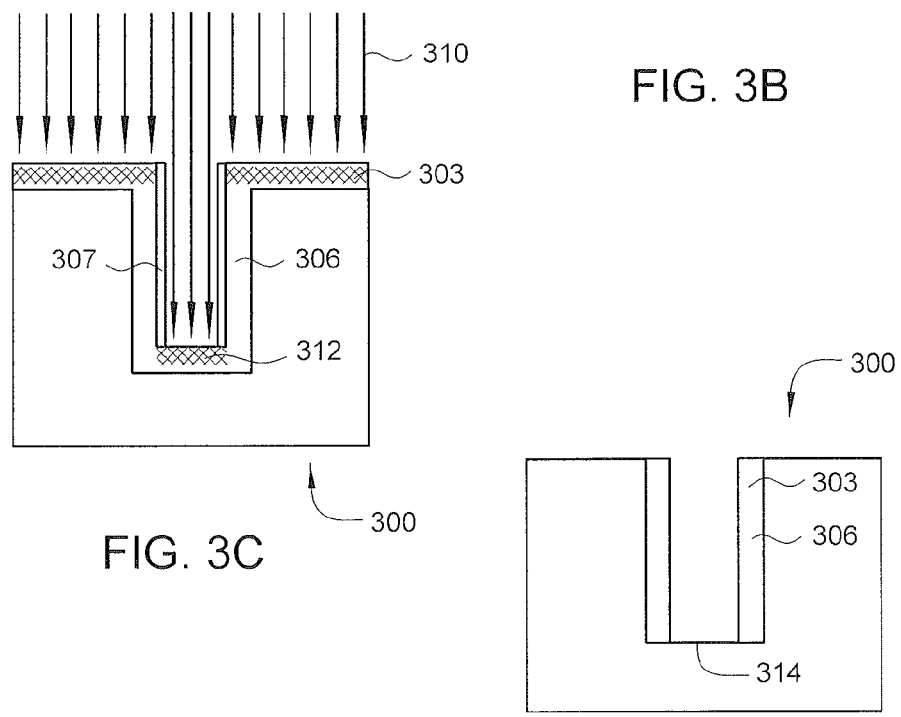
FIG. 3C
FIG. 3D

US 8,980,761 B2

DIRECTIONAL SIO₂ ETCH USING LOW-TEMPERATURE ETCHANT DEPOSITION AND PLASMA POST-TREATMENT

CROSS-REFERENCE TO RELATED APPLICATIONS

This application claims benefit of U.S. Provisional Patent Application Ser. No. 61/744,909 (APPM/17909L02), filed Oct. 3, 2012, which is herein incorporated by reference.

BACKGROUND OF THE INVENTION

1. Field of the Invention

Technology described herein relates to directional etching of native oxides. Specifically, technology described herein relates to post-treatment of an oxide surface to selectively etch the oxide surfaces.

2. Description of the Related Art

With the increase in transistor density and subsequent decrease in the cross-sectional dimensions of device nodes, which can be less than 22 nm, pre-clean of native oxides is of particular importance. Pre-clean can include pre-contact clean or pre-silicide clean which requires removal of oxides from the bottom of vias or trenches of narrowing cross-sectional dimensions. As critical dimension of semiconductor devices decreases, distances between neighboring features formed on a semiconductor substrate are also shortened. Thus, it is important to control etching between vias and trenches during precleaning to prevent damaging nearby features.

Current precleaning techniques generally includes a conformal etch of the substrate to remove the native oxides, such as $SiO_2$, prior to deposition of silicides or other contacts. However, a standard conformal etch can lead to excessive cross-sectional enlargement of vias and trenches thus creating possible leakage and ultimate device failure. Other precleaning techniques such as sputter etching can remove the native oxides from upper surfaces. However, the sputtering can lead to redeposition of the oxides at the via or trench opening. The redeposited oxides prevent subsequent deposition in the vias and trenches leading to poor subsequent contact fill.

Thus, methods are needed to preferentially etch from the bottom surfaces of features to prevent damage to features during precleaning.

SUMMARY OF THE INVENTION

Embodiments described herein generally relate to selective etching of native silicon oxides. In one embodiment, a method can include positioning a substrate comprising silicon in a processing chamber; delivering a plasma to the surface of the substrate while biasing the substrate; and exposing the surface of the substrate to ammonium fluoride ($NH_4F$).

In another embodiment, a method can include positioning a silicon-containing substrate in a processing chamber, the silicon-containing substrate can include an exposed surface with one or more features formed in the exposed surface; and a native oxide layer formed on the exposed surface; cooling the substrate to a first temperature; exposing the surface of the substrate to ammonium fluoride ($NH_4F$) at the first temperature; biasing the substrate; exposing the substrate to a low energy inert plasma to selectively form one or more volatile products on the top and bottom surfaces of the features; exposing the substrate to low pressure at a second temperature to sublimate the non-reacted $NH_4F$ from the surface of the substrate; and heating the substrate to a third temperature, which is higher than the first and second temperature, to sublimate the one or more volatile products.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

FIGS. 3A-3D are graphical representations of a substrate etched according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for removing native oxides are described herein. Precleaning of surfaces in vias and trenches can lead to etching of sidewalls and subsequent reduction of cross sectional dimensions. This reduction of cross-sectional dimensions can lead to device failure. The embodiments described herein allow for etching of surfaces to remove native oxides from bottoms of vias and trenches while preserving the cross-sectional dimensions of the via or trench. By treatment with an etchant at low temperatures, biasing the substrate and activation of the etchant by plasma treatment, the etchant on the bottom surfaces of trenches and vias will be etched preferentially over sidewall surfaces.

By employing a directional post-treatment of the native oxide surface after to conformal exposure to an etchant at low temperatures, the etchant on the affected surface is activated for etching while the non-activated surface is nominally etched due to desorption of the etchant before annealing. The invention is more fully explained with reference to the figures below.

Figure 1:
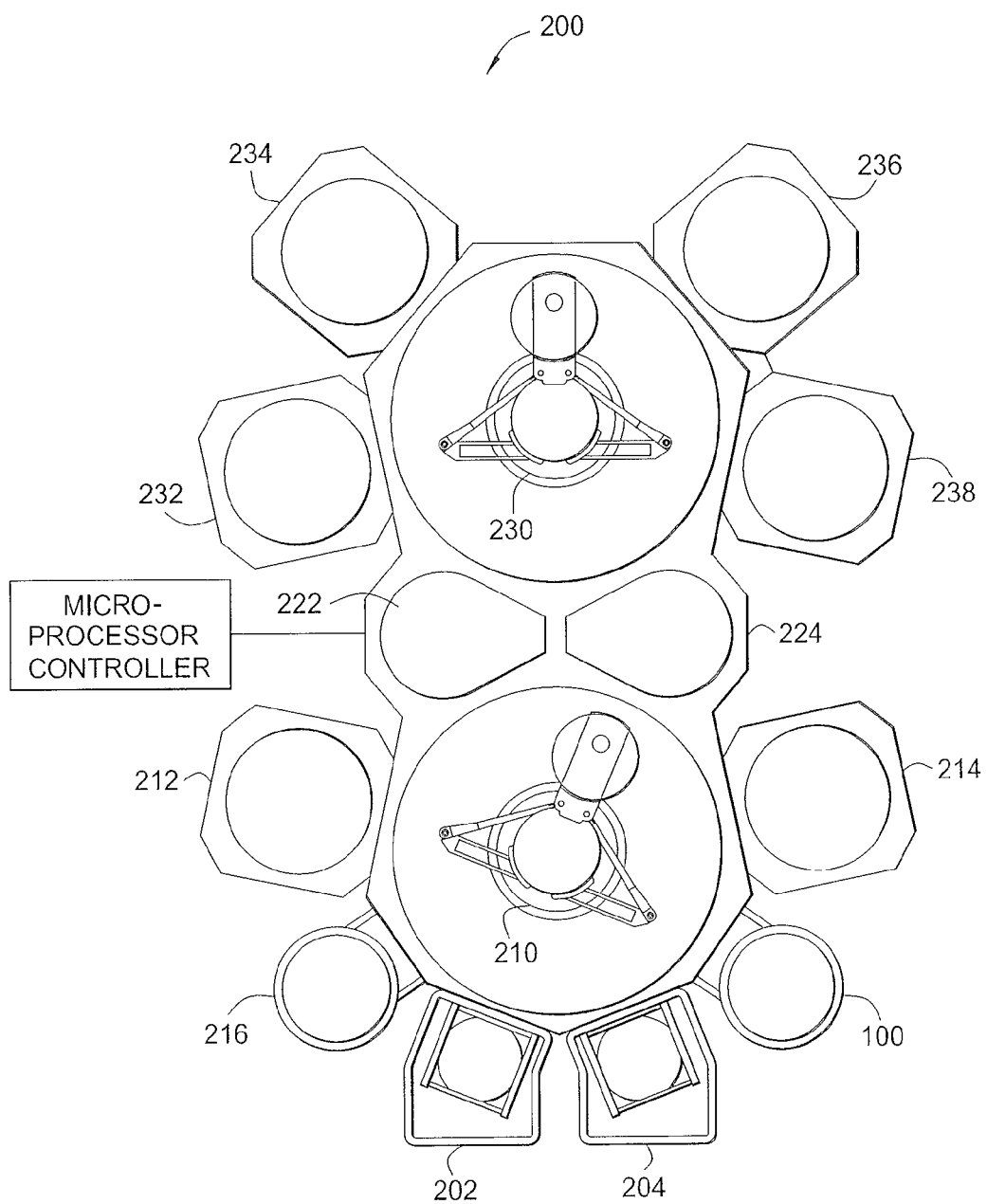
FIG. 1 is a schematic top-view diagram of an illustrative multi-chamber processing system useable with embodiments described herein.

FIG. 1 is a schematic top-view diagram of an illustrative multi-chamber processing system 200 that can be adapted to perform processes as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can "pump down" the substrates introduced into the system 200. A first robot 210 can transfer the substrates between the load lock chambers 202, 204, and a first set of one or more substrate processing chambers 212, 214, 216, 100 (four are shown). The position of the processing chamber 100 relative to the other chambers 212, 214, 216 us for illustration, and the position of the processing chamber 100 may be optionally be switched with any one of the processing chambers 212, 214, 216 if desired.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 can transfer the substrates between the transfer chambers 222, 224 and a second set of one or more processing chambers 232, 234, 236, and 238. Similar to processing chambers 212, 214, 216, 100, the processing chambers 232, 234, 236, 238 can be outfitted to perform a variety of substrate processing operations.

Figure 2:
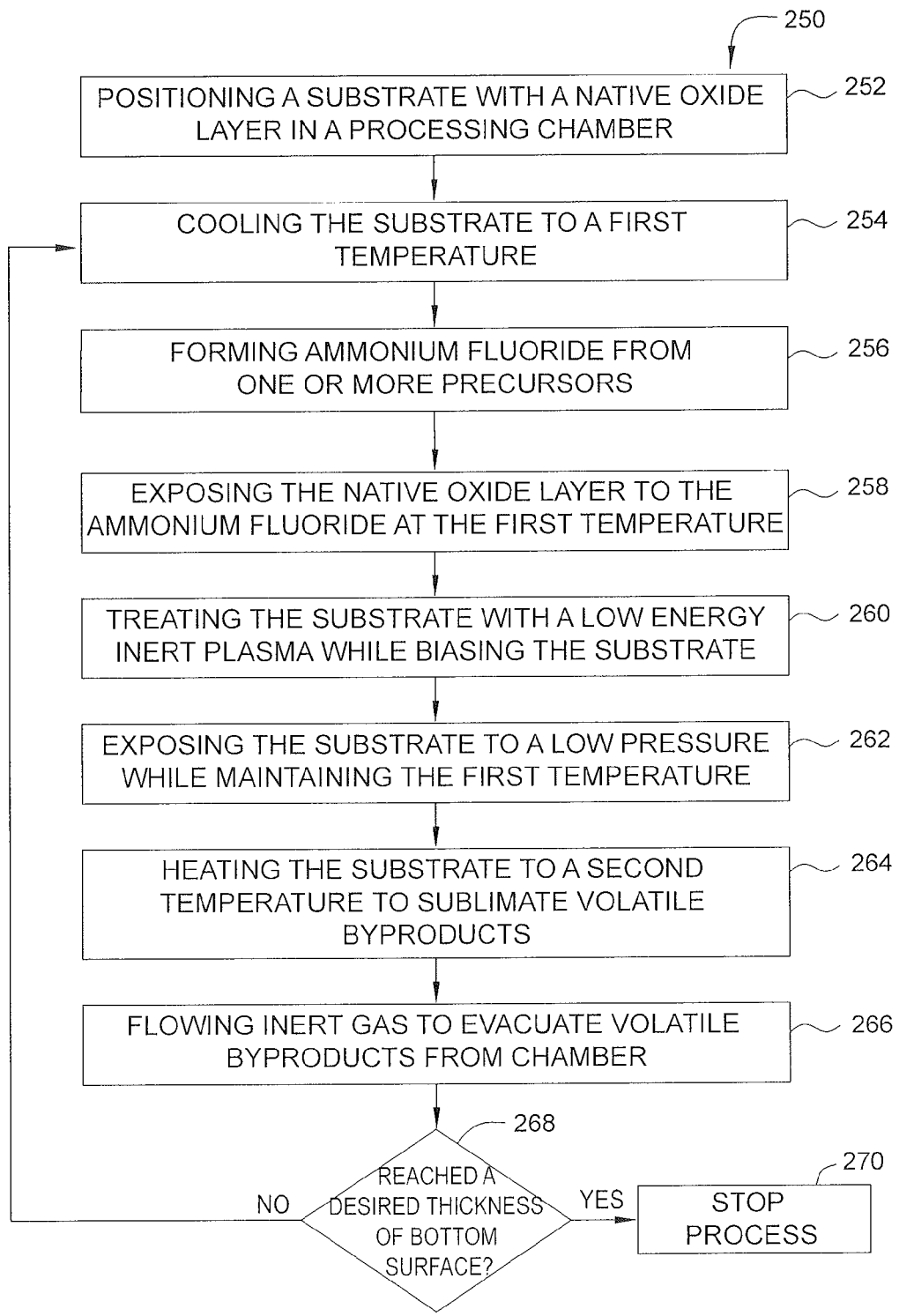
FIG. 2 is a diagram of a method for directional etching according to one embodiment.

FIG. 2 is a diagram of a method for directional etching according to one embodiment. The method 250 can include positioning a substrate with a native oxide layer in the processing chamber, as in 252. The processing chamber can be a processing chamber as described with reference to FIG. 1 or it can be a different processing chamber. The processing chamber should be capable of at least maintaining the substrate at a specific temperature, biasing the substrate and forming $NH_4F$ (e.g. creating $NH_4F$ remotely in a plasma). The substrate can be a silicon substrate with features formed on the surface. The features can include one or more of vias and trenches of varying cross-sectional dimensions, such as less than 27 nm. Native oxides may be formed on one or more of the surfaces of the substrate, such as a silicon dioxide formed on all exposed surfaces. The native oxides may also be of varying thickness dependant on the circumstances of formation, such as exposure to the atmosphere. Other layers or features may be formed under the silicon oxide, such as a layer of silicon nitride or metal silicides.

The method 250 can further include cooling the substrate to a first temperature, as in 254. An $NH_4F$ etching is a dry etch process for removing one or more silicon oxides using an ammonia ($NH_3$) and nitrogen trifluoride ($NF_3$) gas mixture performed within a processing chamber. The substrate is generally cooled to a temperature which allows deposition of $NH_4F$ but below the reaction temperature. This temperature will be dependent on process conditions such as processing chamber pressure. In one or more embodiments, the substrate can be cooled to a temperature below 15° C., such as between 15° C. and 0° C., using a cooling apparatus formed within the support member. In one embodiment, the substrate is maintained at 10° C. In another embodiment, the substrate is maintained at a temperature of between 10° C. and 0° C.

The method 250 can further include forming ammonium fluoride ($NH_4F$) to deposit the etchant, as in 256. An $NH_4F$ etching is a dry etch process for removing one or more silicon oxides using an ammonia ($NH_3$) and nitrogen trifluoride ($NF_3$) gas mixture performed within a processing chamber. The substrate is generally cooled to a temperature below the reaction temperature of $NH_4F$.

The method 250 can further include exposing the substrate to $NH_4F$ introduced to the chamber for removing silicon oxides on a surface of the substrate, as in 258. In one embodiment, ammonia and nitrogen trifluoride gases are then introduced into the plasma chamber to form the etching gas mixture. The amount of each gas introduced into the plasma chamber is variable and may be adjusted to accommodate, for example, the thickness of the oxide layer to be removed, the geometry of the substrate being cleaned, the volume capacity of the plasma, the volume capacity of the chamber, as well as the capabilities of the vacuum system coupled to the chamber. The ratio of the etching gas mixture may be predetermined to remove various oxides on the substrate surface. The ratio of gas mixture in the etching gas mixture may be adjusted to preferentially remove the post-treated oxides, such as native oxides formed on the top and bottom surfaces of the features. In one embodiment, molar ratio of ammonia to nitrogen trifluoride in the etching gas mixture may be set to uniformly remove silicon oxides.

In one embodiment, etching rate of the etching gas mixture may be adjusted by adjusting a flow rate of nitrogen trifluoride while maintaining a molar ratio of ammonia and nitrogen trifluoride above a predetermined value. In one embodiment, etching rate may be increased or decreased by increasing or decreasing the flow rate of nitrogen trifluoride while the ratio of ammonia and nitrogen trifluoride remains above about 3:1. In another embodiment, ratio of ammonia and nitrogen trifluoride can be about 1:1.

The ammonia and nitrogen trifluoride gases can be dissociated into reactive species in a remote plasma chamber. The dissociated species can combine to form a highly reactive ammonia fluoride ($NH_4F$) compound and/or ammonium hydrogen fluoride ($NH_4F.HF$) in the gas phase. These molecules react with the substrate surface to be processed. In one embodiment, the carrier gas is first introduced into the chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F.HF$, reacts with the silicon oxide surface to form ammonium hexafluorosilicate $(NH_4)_2SiF_6$, $NH_3$, and $H_2O$ products. The $NH_3$ and $H_2O$ are vapors at processing conditions and removed from the chamber by a vacuum pump. A thin film of $(NH_4)_2SiF_6$ is left behind on the substrate surface. This reaction mechanism can be summarized as follows:

$$NF_3 + 3NH_3 \rightarrow NH_4F + NH_4F.HF + N_2$$

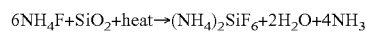

$$6NH_4F + SiO_2 + heat \rightarrow (NH_4)_2SiF_6 + 2H_2O + 4NH_3$$

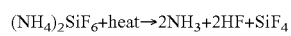

$$(NH_4)_2SiF_6 + heat \rightarrow 2NH_3 + 2HF + SiF_4$$

The reaction as shown above requires temperature to both form $(NH_4)_2SiF_6$ and to sublimate the $(NH_4)_2SiF_6$ to $NH_3$, HF, $SiF_4$. By cooling the substrate below an activation, the $NH_4F$ is present on the surface but nominally reacting with the silicon oxide.

The method 250 can further include treating the substrate with a low energy inert plasma while biasing the substrate, as in 260. The inert plasma can comprise any inert gas. Inert gases include noble gases, such as helium or argon. The inert plasma is formed into a plasma of sufficiently low energy so as to not sputter the substrate. Stated another way, the inert plasma is a primarily ionized species so that the directionality is random. The inert plasma may be either formed remotely in a plasma chamber and delivered to the chamber or formed inside the chamber itself.

The inert plasma is flowed toward the substrate which is simultaneously biased. The bias on the substrate can be of any power level which will not promote sputtering, such as between 25 W and 250 W. The bias can be delivered at varying frequencies, such as a bias of 350 kHz, 13.56 MHz, 60 MHz or combinations thereof. As previously disclosed, the inert plasma is a low energy plasma which is largely ionized, thus having a random directional movement. The bias applied to the substrate attracts the ionized gas in the plasma toward the substrate, where the ionized gas strikes surfaces which are perpendicular to the direction of ionized gas movement, such as the bottom of a via or trench on a substrate. The ionized gas provides activation energy for the formation of $(NH_4)_2SiF_6$ from NH$_4$F as previously disposed on the surface and SiO$_2$ as present in the native silicon oxide layer.

The method 250 can further include exposing the substrate to a low pressure while maintaining the first temperature, as in 262. After the NH$_4$F and SiO$_2$ are reacted, the non-reacted NH$_4$F, which is primarily on the sidewalls of the vias and trenches, can be low pressure sublimated at a low temperature. Low pressures can include any pressures which will allow for desorption of non-reacted NH$_4$F, such as a pressure of 20 mTorr. The low pressure allows for desorption of the non-reacted NH$_4$F. Further, by keeping the temperature low, the non-reacted NH$_4$F will not react with the remaining SiO$_2$ to create (NH$_4$)$_2$SiF$_6$ on undesired areas, such as on the sidewalls of trenches and vias. Non-reacted precursors are then removed from the chamber so as to not affect further processing.

The method 250 can further include removing the (NH$_4$)$_2$SiF$_6$ by heating the substrate to a second temperature to sublimate volatile byproducts, as in 264. After the thin film is formed on the substrate surface, the support member may be elevated to an anneal position in close proximity to a heated gas distribution plate. The heat radiated from the gas distribution plate may dissociate or sublimate the thin film of (NH$_4$)$_2$SiF$_6$ into volatile SiF$_4$, NH$_3$, and HF products. These volatile products are then removed from the chamber by the vacuum pump as described above. Typically, a temperature of 75° C. or more is used to effectively sublimate and remove the thin film from the substrate. Preferably, a temperature of 100° C. or more is used, such as between about 115° C. and about 250° C.

The method 250 can further include flowing inert gas to evacuate the volatile byproducts from the chamber, as in 266. The thermal energy to dissociate the thin film of (NH$_4$)$_2$SiF$_6$ into its volatile components is transferred by the gas distribution plate through convection or radiation. In one aspect, the distribution plate is heated to a temperature of between 100° C. and 150° C., such as about 120° C. Further embodiments use a low energy plasma, such as a plasma as described with reference to the post-treatment process, to enhance the sublimation of volatile byproducts. The plasma is delivered to the surface of the substrate uniformly and at an energy level which will not sputter the oxides form the substrate. By using a low energy plasma while simultaneously heating the substrate, it is believed that the activation energy for sublimation can be reduced. For example, a layer of (NH$_4$)$_2$SiF$_6$ may be of a certain thickness which requires a temperature of 120° C. over a certain time period to sublimate. By using a low energy plasma, the layer of (NH$_4$)$_2$SiF$_6$ can be sublimated at 100° C. over the same time period or at 120° C. over a shorter time period.

The method can further include making a determination of whether a desired thickness of the bottom surface has been reached, as in 268. If a desired etch rate has not been achieved, the substrate can be cooled to the first temperature and the process can begin again. Based on the selectivity and the directionality, the process can be repeated numerous times to achieve desired results, such as repeating the process 10 times. Further, though the general steps are repeated in each cycle, the individual steps can be any disclosed embodiment, without regard to the previous embodiment chosen at that step. For example, if a helium plasma was delivered to a substrate with a bias of 100 W in the first cycle, the second cycle could be an argon plasma delivered to the substrate with a 50 W bias.

If a desired etch rate has been achieved, the process can be ended, as in 270. The processing chamber is purged and evacuated. The processed substrate is then removed from the chamber by lowering the substrate member to the transfer position, de-chucking the substrate, and transferring the substrate through a slit valve opening.

Without intending to be bound by theory, it is believed that at low temperatures, the chemical etch rate is practically zero because the NH$_4$F etchant deposits but does not form (NH$_4$)$_2$SiF$_6$. During a standard NH$_4$F etch process, the substrate will be maintained at a temperature less than 40° C., such as a temperature between 25° C. and 40° C. In this temperature range, the reaction between the NH$_4$F and the oxide layer on the substrate is believed to be reaction limited, such that higher levels of reactant will lead to increased and uniform etching of the oxide layer. When the temperature is raised below the reaction temperature, the deposition rate no longer reflects the formation of (NH$_4$)$_2$SiF$_6$. Therefore, the areas of silicon oxide have the reactants present but do not have the energy required to make the product. The areas which have been post-treated with the inert plasma, however, form (NH$_4$)$_2$SiF$_6$.due to directional energy provided by the inert plasma. As such, at temperatures below 15° C., the silicon oxide is not etched in areas not targeted by inert plasma (e.g. side walls of vias and trenches) and it is etched in targeted areas (e.g. upper surface of the substrate and bottoms of trenches).

Important to note is that the etching process is further selective for etching of silicon oxide over other layers which may be disposed on the substrate. NH$_4$F etchant will etch silicon oxide without substantial etching of layers such as silicon nitride or metal silicides. The experimentally determined selectivity between SiO$_2$ and SiN is greater than 7:1 and in some examples greater than 9:1. Selectivity of SiO$_2$ to Si is at least greater than 5:1. Thus, the above method provides for both selectivity and directionality in etching of native oxides.

FIGS. 3A-3D are graphical representations of a substrate 300 etched according to one or more embodiments. FIG. 3A depicts a substrate 300 with a native oxide layer 303 according to one embodiment. The substrate 300 can be a silicon-containing substrate, such as a crystalline silicon substrate. The substrate 300 has an upper surface 302. The upper surface 302 has a native oxide layer 303 formed thereon, such as a silicon oxide layer formed on a silicon-containing substrate. The native oxide layer 303 can be a result of transfer between chambers (i.e., exposure to atmosphere). The substrate 300 can further have vias and trenches formed therein, such as a via 308. The native oxide layer 303 can be deposited on sidewall surfaces 306 of features and bottom surfaces 304 of features. The substrate 300 can be positioned in a processing chamber as described above.

FIG. 3B depicts a substrate during low temperature treatment with NH$_4$F etchant according to one embodiment. The NH$_4$F etchant 307 can be conformally deposited on the native oxide surface 303. When this step is performed at temperatures lower than 15° C., such as 10° C., the NH$_4$F etchant will not react with the native oxide layer 303 to form (NH$_4$)$_2$SiF$_6$. It is preferred that the NH$_4$F etchant 307 be present on the surface of the substrate for as short a time as possible to prevent spontaneous formation of (NH$_4$)$_2$SiF$_6$.

FIG. 3C depicts a substrate 300 during plasma treatment according to one embodiment. The substrate 300 is treated with a low energy inert plasma 310, as described with reference to the embodiments above. The plasma 310 can activate the NH4F etchant 307 on the top and bottom surfaces 304 to form the etchant layer 312. The etchant layer comprises both (NH$_4$)$_2$SiF$_6$ from the activation with plasma, as well as unreacted NH$_4$F etchant. The substrate should be maintained at a temperature below 15° C., such as 10° C., to prevent activity of the NH$_4$F etchant 307 on the sidewalls. The NH$_4$F etchant 307 deposited on sidewall surfaces 306 is largely unaffected by the plasma 310. The bias in the substrate 300 provides directionality to the plasma 310 to prevent the plasma 310 from targeting the sidewall surfaces 306. The bias delivered to the substrate can be between 25 W and 200 W.

FIG. 3D depicts the substrate 300 after etching with the $NH_4F$ etchant, according to one embodiment. After the $(NH_4)_2SiF_6$ film 312 is formed on and from the top and bottom surfaces 304, the remaining $NH_4F$ etchant 307 is desorbed from the surface by low pressure while maintaining the temperature below 15° C., or preferably below 10° C. Further embodiments can include altering pressure or temperature to optimize the desorption of the $NH_4F$ etchant 307 from the sidewall surface 306. In another embodiment, the temperature is increased to a temperature above the dew point of the $NH_4F$ etchant 307, such as above 70° C. In this way, the desorption rate is increased while preventing adsorption of the $NH_4F$ etchant 307 on the sidewall surfaces 306 of the substrate 300.

Next, the substrate is annealed to sublimate the $(NH_4)_2SiF_6$ film thus exposing the cleaned surfaces 314. The substrate 300 is heated to a second temperature, such as a temperature higher than 75° C., with preferred embodiments of greater than 100° C. The thickness and composition of sidewall surfaces 306 are substantially unchanged.

Figure 4:
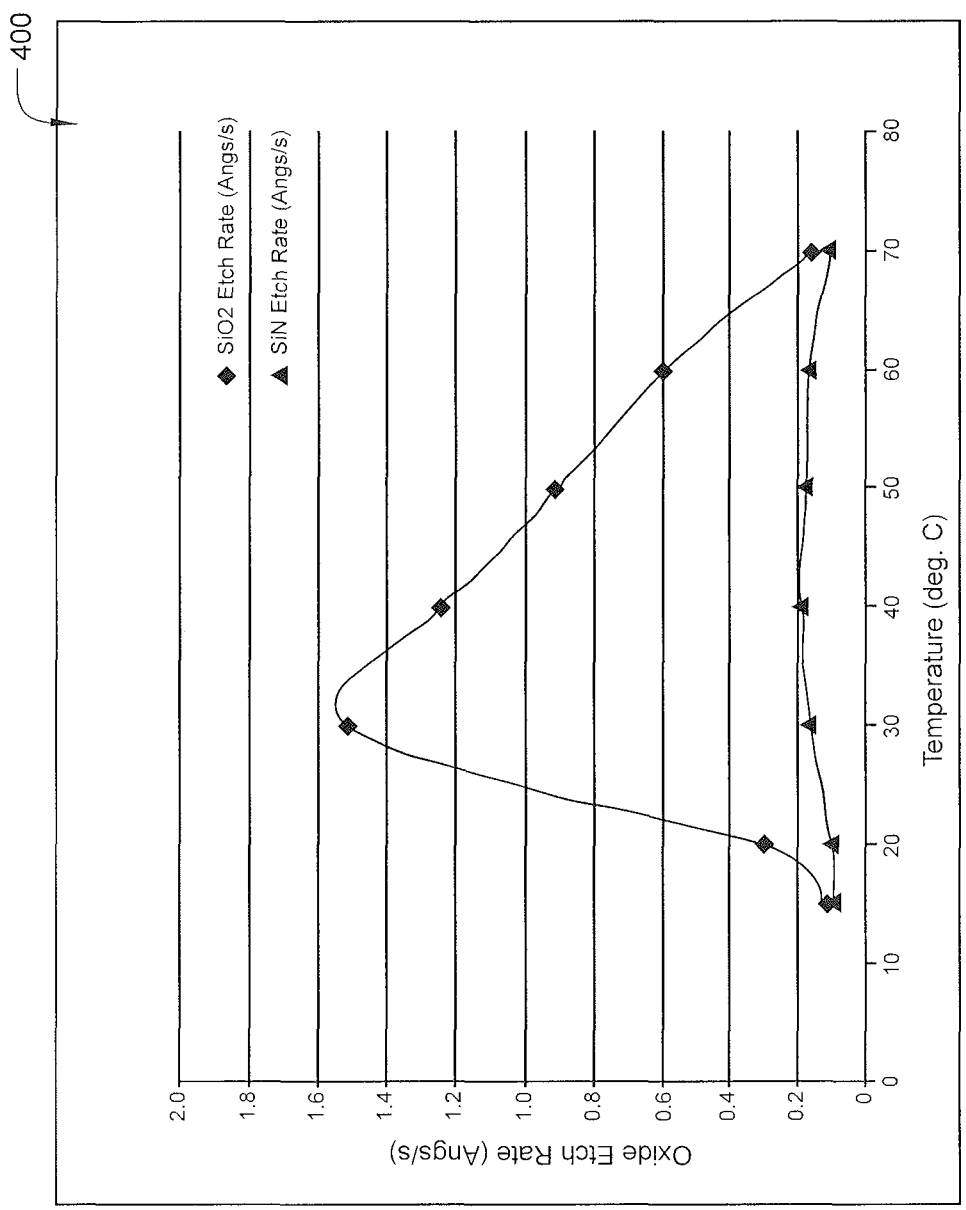
FIG. 4 depicts etch rate of the silicon oxide and silicon nitride as a function of pedestal temperature according to one embodiment.

FIG. 4 depicts etch rate of the silicon oxide and silicon nitride as a function of pedestal temperature according to one embodiment. Etch rates were measured and plotted as shown in the graph with the oxide etch rate in A/sec. over temperature in degrees C. The silicon nitride showed no substantial etching at any temperature in comparison to the silicon oxide. Silicon oxide etching increases linearly in the presence of $NH_4F$ in temperatures between 15° C. and 30° C. From 30° C. to about 70° C. the silicon oxide surface decreases until it reaches the etch rate of silicon nitride. The decline in etch rate for silicon oxide after 30° C. is believed to be related to an increase in desorption of the $NH_4F$ from the surface of the substrate prior to the formation of $(NH_4)_2SiF_6$. At temperatures higher than 70° C., the etch rate on the untreated surface is substantially lower than either the prior temperature untreated surface etch rate or the treated surface etch rate. It is believed that, at this temperature or above, the adsorption rate and the desorption rate are equal. Thus, a minimal amount of $(NH_4)_2SiF_6$ is formed on the silicon oxide. Thus by maintaining the temperature of the deposited $NH_4F$ either below 15° C. or above 70° C., the formation of $(NH_4)_2SiF_6$ in the presence of $NH_4F$ on silicon oxide can be controlled for directional etching.

CONCLUSION

Embodiments described herein relate to methods of directional removal of native oxides form a surface. Above embodiments show preferential etching of post-treated surfaces over untreated surfaces. $SiO_2$ is formed natively on silicon surfaces and must be removed for proper deposition in vias and trenches. However, it is important to avoid changing the cross-sectional dimensions of the modern day vias and trenches, which can lead to device failure. A deposition of $NH_4F$ at a low temperature will be effective for depositing the $NH_4F$ conformally with limited formation of $(NH_4)_2SiF_6$ on the silicon oxide. Subsequently, by treating a biased substrate with a low energy inert plasma, the $(NH_4)_2SiF_6$ layer will form preferentially on the bottom and top horizontal surfaces over the sidewall surfaces. Subsequent annealing will be effective for removing the plasma-treated $SiO_2$ without affecting the untreated $SiO_2$ on the side walls of the vias or trenches.

While the foregoing is directed to embodiments of the present invention, other and further embodiments of the invention may be devised without departing from the basic scope thereof, and the scope thereof is determined by the claims that follow.

What is claimed is:

1. A method comprising:
   positioning a substrate comprising silicon in a processing chamber;
   delivering a plasma to the surface of the substrate while biasing the substrate;
   after delivering the plasma, cooling the substrate to a temperature below the reaction temperature of ammonium fluoride ($NH_4F$) or ammonium hydrogen fluoride ($NH_4F(HF)$); and
   with the substrate cooled to a temperature below the reaction temperature, exposing the surface of the substrate to $NH_4F$ or $NH_4F(HF)$.

2. The method of claim 1, further comprising cooling the surface of the substrate to a temperature at or below 15° C. while exposing the surface of the substrate to $NH_4F$.

3. The method of claim 1, wherein the delivery of the plasma and the exposure to $NH_4F$ is repeated a plurality of times before annealing the substrate.

4. The method of claim 1, further comprising maintaining the substrate at temperatures at or below 15° C. while delivering the plasma.

5. The method of claim 1, wherein the plasma comprises an inert plasma.

6. The method of claim 1, further comprising annealing the substrate to a temperature above 100° C.

7. The method of claim 1, wherein the $NH_4F$ or the $NH_4F$ (HF) are formed by remote plasma.

8. The method of claim 1, further comprising biasing the substrate at a frequency of from 200 kHz to 60 MHz.

9. The method of claim 1, wherein the $NH_4F$ or the $NH_4F$ (HF) are formed using a gas mixture comprising a 3:1 ratio of ammonia ($NH_3$) and nitrogen trifluoride ($NF_3$), respectively.

10. A method, sequentially comprising:
    positioning a silicon-containing substrate in a processing chamber, the silicon-containing substrate comprising:
      an exposed surface with one or more features formed in the exposed surface; and
      a native oxide layer formed on the exposed surface;
    cooling the substrate to a first temperature at a first pressure, the first temperature being below the reaction temperature of ammonium fluoride ($NH_4F$) or ammonium hydrogen fluoride ($NH_4F(HF)$);
    exposing the surface of the substrate to ammonium fluoride ($NH_4F$) at the first temperature;
    biasing the substrate;
    exposing the substrate to a direct plasma to selectively form one or more volatile products on the top and bottom surfaces of the features;
    exposing the substrate to a second pressure at a second temperature to sublimate the non-reacted $NH_4F$ from the surface of the substrate; and
    heating the substrate to a third temperature, which is higher than the first temperature, to sublimate the one or more volatile products.

11. The method of claim 10, wherein the first temperature is less than 15° C.

12. The method of claim 10, wherein the second temperature is greater than 70° C.

13. The method of claim 10, wherein the second temperature is less than 15° C.

14. The method of claim 10, wherein the third temperature is a temperature of greater than 100° C.

15. The method of claim 10, wherein a plasma comprising $NH_4F$ is formed remotely.

16. The method of claim 10, further comprising maintaining the substrate at the first pressure and the first temperature while delivering the direct plasma.

17. The method of claim 10, wherein the $NH_4F$ is formed from a gas mixture comprising ammonia ($NH_3$) and nitrogen trifluoride ($NF_3$).

18. The method of claim 17, wherein the gas mixture is a 3:1 ratio of ammonia ($NH_3$) and nitrogen trifluoride ($NF_3$), respectively.

19. The method of claim 10, wherein the surface of the substrate is further exposed to ammonium hydrogen fluoride ($NH_4F(HF)$).

20. The method of claim 10, wherein second pressure is lower than the first pressure.

* * * * *

UNITED STATES PATENT AND TRADEMARK OFFICE
CERTIFICATE OF CORRECTION

PATENT NO.       : 8,980,761 B2                                Page 1 of 1
APPLICATION NO.  : 14/031371
DATED            : March 17, 2015
INVENTOR(S)      : Or et al.

It is certified that error appears in the above-identified patent and that said Letters Patent is hereby corrected as shown below:

In the Specification

Column 4, Line 19, please delete "($NH_4F.HF$)" and insert -- ($NH_4F \cdot HF$) -- therefor;

Column 4, Line 34, please delete "$NF_3 + 3NH_3 \rightarrow NH_4F + NH_4F.HF + N_2$" and insert -- $NF_3 + 3NH_3 \rightarrow NH_4F + NH_4F \cdot HF + N_2$ -- therefor;

Column 7, Line 30, please delete "A/sec" and insert -- Å/sec -- therefor.

Signed and Sealed this
Eighth Day of September, 2015

Michelle K. Lee
*Director of the United States Patent and Trademark Office*